(12) United States Patent
Okuwaki et al.

(10) Patent No.: US 8,249,833 B2
(45) Date of Patent: Aug. 21, 2012

(54) APPARATUS AND METHOD FOR VERIFYING MODEL-DESIGN, AND PROGRAM THEREOF

(75) Inventors: Yoshihito Okuwaki, Kawasaki (JP); Yoshikazu Katou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1172 days.

(21) Appl. No.: 11/441,132

(22) Filed: May 26, 2006

(65) Prior Publication Data

US 2007/0185692 A1 Aug. 9, 2007

(30) Foreign Application Priority Data

Feb. 7, 2006 (JP) .................................. 2006-029444

(51) Int. Cl.
*G06F 17/50* (2006.01)
(52) U.S. Cl. ............................................................ 703/1
(58) Field of Classification Search .................. 703/1
See application file for complete search history.

(56) References Cited

U.S. PATENT DOCUMENTS

| 5,815,400 | A | * | 9/1998 | Hirai et al. | .................... | 700/173 |
| 6,973,358 | B2 | * | 12/2005 | Yamamoto et al. | .............. | 700/98 |

FOREIGN PATENT DOCUMENTS

| JP | 9-265491 | 10/1997 |
| JP | 2005-233911 | 9/2005 |
| JP | 2006-48221 | 2/2006 |

OTHER PUBLICATIONS

Robert V. MacKenzie, "Screw Threads Design, Selection and Specification", 1961, The Industrial Press, pp. 8-18.*
A.E.R. Peterka, "Bolts, Nuts & Screws", 1944, The Lamson & Sessions Company, p. 57.*
Nohiro Abe et al., "Verification of assemblability of mechanical parts and visualization of machinery of assembly in virtual space", 1997, ICAT, pp. 208-215.*
LKW Kelheim: Gewindeschneiden. 2003 [searched on Oct. 30, 2007]. On the Internet: <URL: http://www.lkw-kelkheim.de/assets/pdf/Gewindeschneiden.PDF>.
Modellbauwerkzeug & Präzisionsmaschinen GmbH: Gewindeschneideeinrichtung. NR. 3100, Jan. 15, 2004. [searched on Nov. 30. 2007]. On the internet: <URL: http://web.archive.org/web/20040115125146/http://thecooltool.com/files/dateien__272.pdf>.
Office Action issued in corresponding German Patent Application No. 102006025490.2-53, on Oct. 31, 2007. Minutes of the Hearing in the matter of corresponding German Patent Application No. 102006025490.2-53, dated Oct. 30, 2007.
Takeshi Uchikawa, "Total Mechanical Design and Manufacturing System", Oki Review, Oki Electric Industry Co., Ltd., Jan. 1, 1992, 153$^{rd}$ Issue, vol. 59, No. 1, pp. 119-124.
Japanese Office Action issued Mar. 15, 2011 in corresponding Japanese Patent Application 2006-029444.

* cited by examiner

*Primary Examiner* — Kandasamy Thangavelu
*Assistant Examiner* — Russ Guill
(74) *Attorney, Agent, or Firm* — Staas & Halsey LLP

(57) ABSTRACT

An interference-check-result sorting unit sorts the result of the interference check on an entire 3D model in a 3D-model storage/display unit that is implemented by an overall interference check unit of a model-design verification system into the interference information related to male-screw models and the interference information related to other models. A tapped-hole-diameter changing unit considers that models that interfere with the male-screw models are tapped-hole models, and changes the tapped-hole diameter of the tapped-hole models. A male-screw model/tapped-hole model interference check unit implements checks on the interferences between the respective male-screw models and the corresponding tapped-hole models whose tapped-hole diameter has been changed. And a verification result output unit outputs the result of the verification on the fits between the male-screw models and the tapped-hole models, based on the interference-check results.

7 Claims, 19 Drawing Sheets

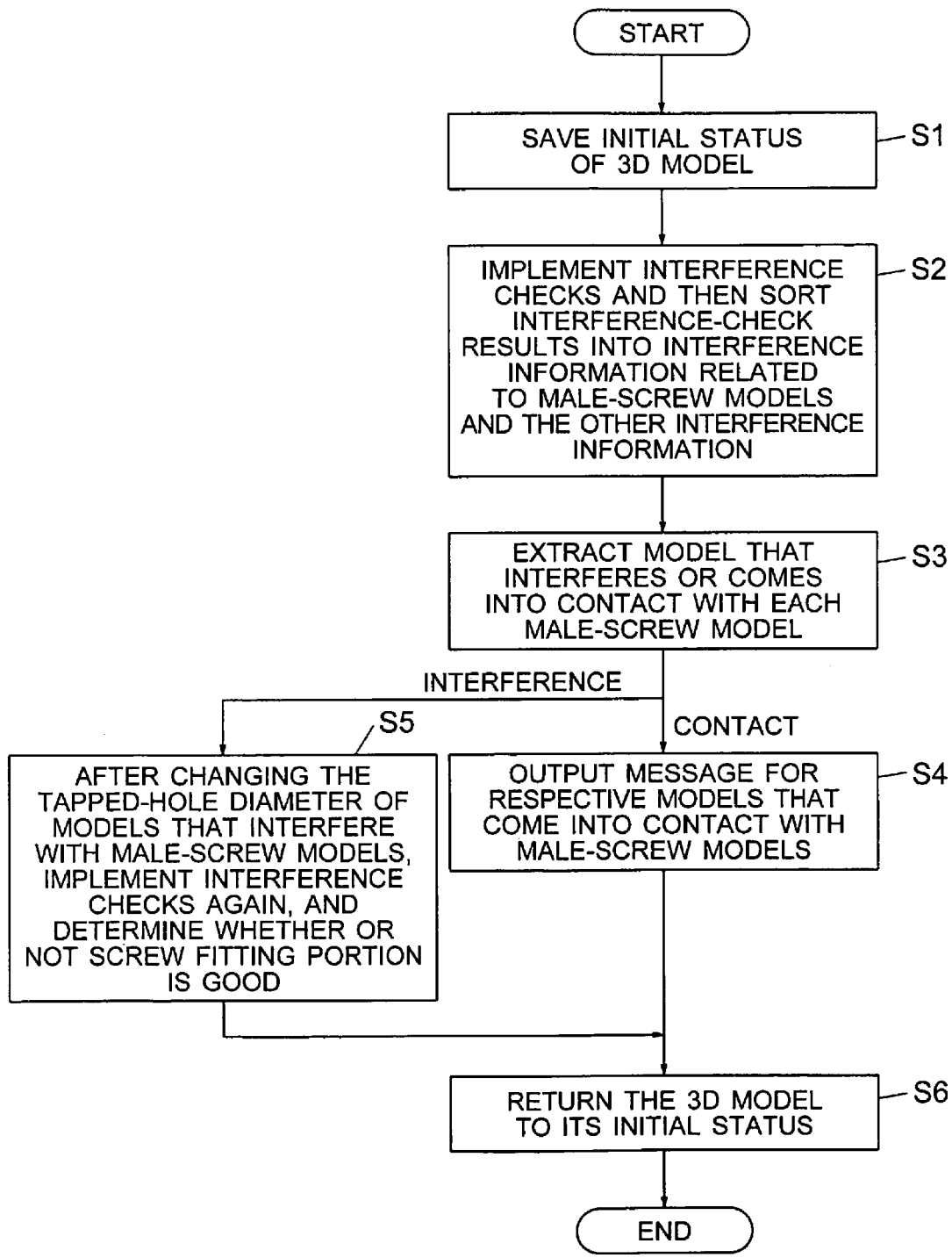

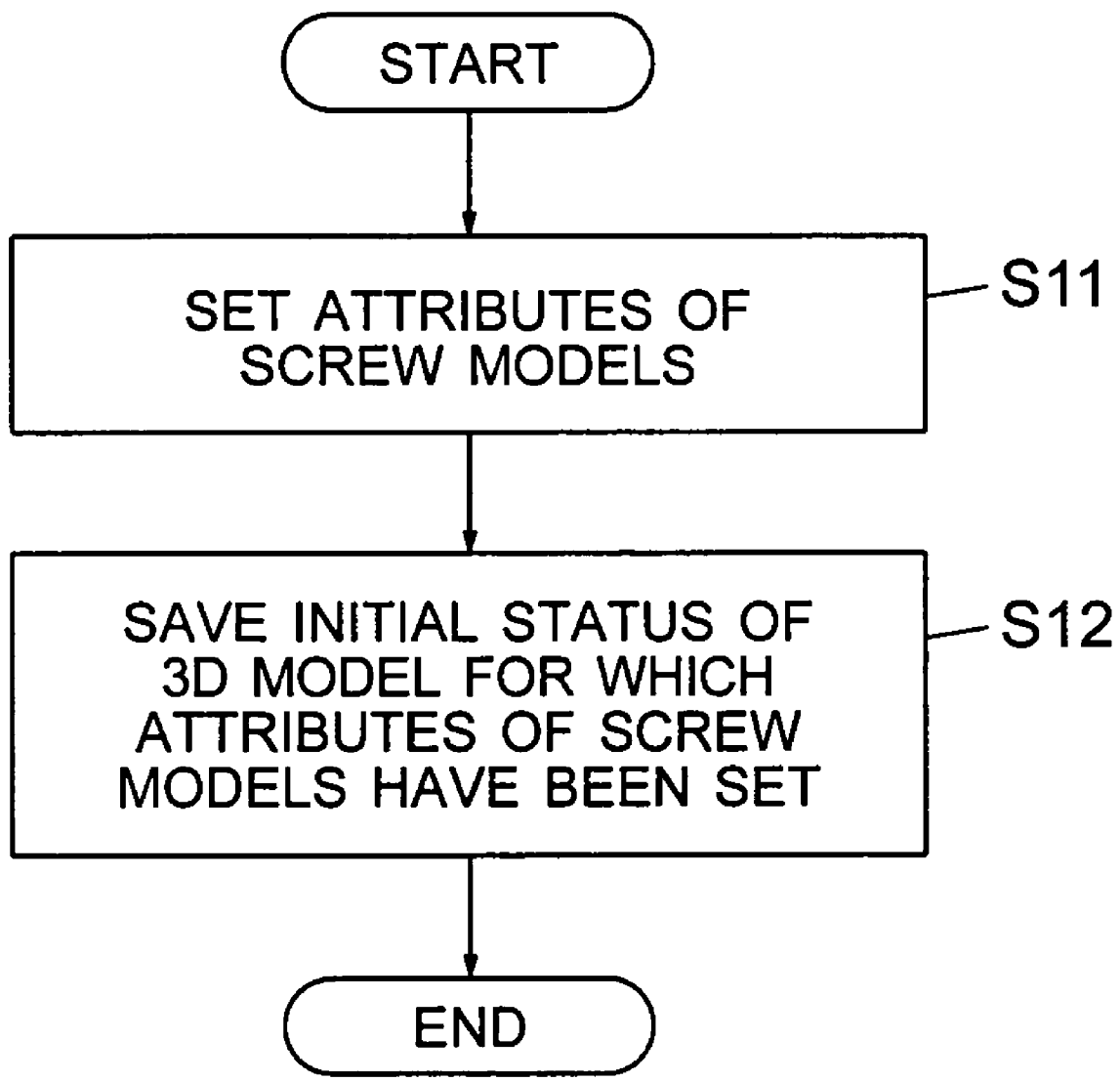

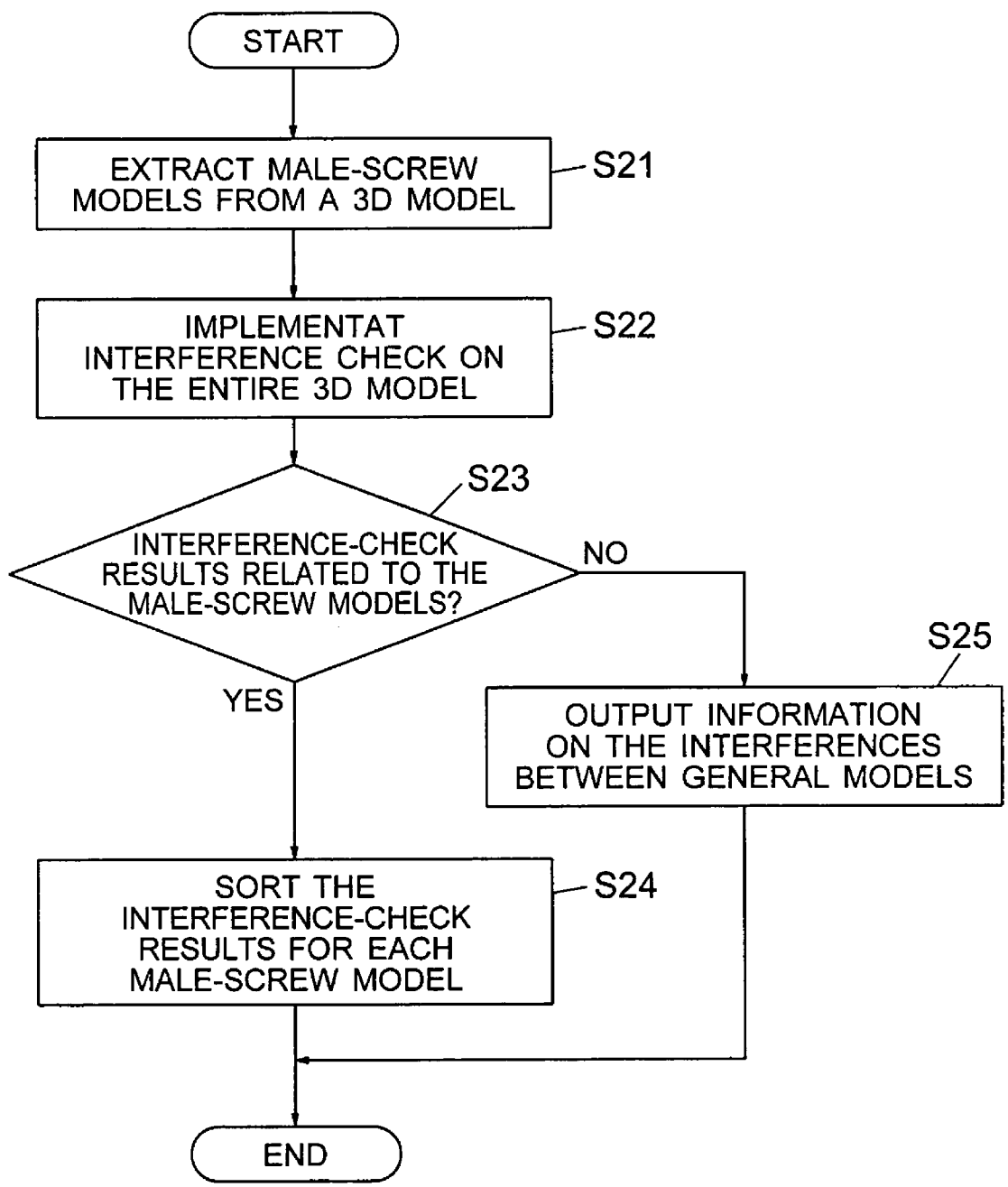

SCREW MODEL A
SCREW MODEL B
SCREW MODEL C
SCREW MODEL D

| No | MODEL 1 | MODEL 2 | MODE |
|---|---|---|---|
| 1. | SCREW MODEL A | COVER MODEL | INTERFERENCE |
| 2. | SCREW MODEL A | BUTTON MODEL | CONTACT |
| 3. | SCREW MODEL B | COVER MODEL | CONTACT |
| 4. | COVER MODEL | FOOT MODEL | INTERFERENCE |
| 5. | BUTTON MODEL | WINDOW MODEL | INTERFERENCE |
| 6. | SCREW MODEL C | COVER MODEL | INTERFERENCE |

FIG. 6A

| No | MODEL 1 | MODEL 2 | MODE |
|---|---|---|---|
| 1. | SCREW MODEL A | COVER MODEL | INTERFERENCE |
| 2. | SCREW MODEL A | BUTTON MODEL | CONTACT |
| 3. | SCREW MODEL B | COVER MODEL | CONTACT |
| 4. | SCREW MODEL C | COVER MODEL | INTERFERENCE |

FIG. 6B

| No | MODEL 1 | MODEL 2 | MODE |
|---|---|---|---|
| 1. | COVER MODEL | FOOT MODEL | INTERFERENCE |
| 2. | BUTTON MODEL | WINDOW MODEL | INTERFERENCE |

FIG. 6C

| No | SCREW MODEL | INTERFERENCE MODEL | CONTACT MODEL |
|---|---|---|---|
| 1. | SCREW MODEL A | COVER MODEL | BUTTON MODEL |
| 2. | SCREW MODEL B |  | COVER MODEL |
| 3. | SCREW MODEL C | COVER MODEL |  |
| 4. | SCREW MODEL D |  |  |

FIG. 13

| CONTENTS OF DEFECTS BETWEEN MALE SCREW AND TAPPED HOLE | MALE SCREW AND TAPPED HOLE ARE MISALIGNED | TAPPED-HOLE DIAMETER IS SMALLER THAN MALE-SCREW DIAMETER | TAPPED-HOLE DIAMETER IS LARGER THAN MALE-SCREW DIAMETER | NO ATTRIBUTE IS GIVEN TO TAPPED HOLE | NORMAL RELATIONSHIP BETWEEN MALE SCREW AND TAPPED HOLE |
|---|---|---|---|---|---|
| INTERFERENCE CHECK RESULTS | INTERFERENCE | INTERFERENCE | NO INTERFERENCE AND NO CONTACT | INTERFERENCE | CONTACT |

FIG. 14

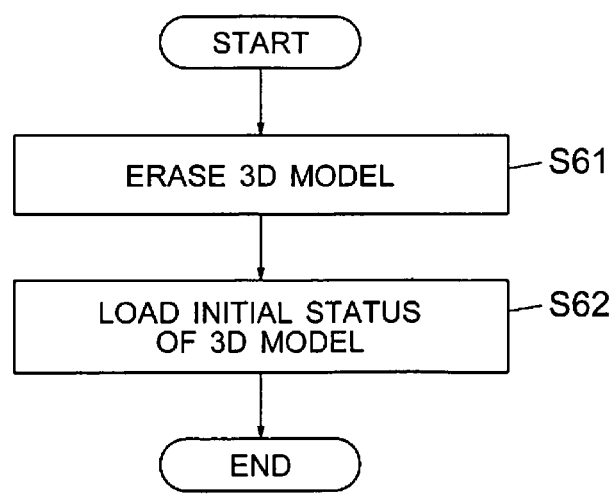

FIG. 16

| RELATIONSHIPS BETWEEN MALE SCREW AND TAPPED HOLE | TAPPED-HOLE DIAMETER | PREPARED-HOLE DIAMETER | SCREW DIAMETER | REMARKS |
|---|---|---|---|---|
| PROBLEMATIC RELATIONSHIP BETWEEN MALE SCREW AND TAPPED HOLE | MALE SCREW AND TAPPED HOLE ARE MISALIGNED | INTERFERENCE | INTERFERENCE | |
| | TAPPED-HOLE DIAMETER IS SMALLER THAN MALE-SCREW DIAMETER | INTERFERENCE | INTERFERENCE | |
| | TAPPED-HOLE DIAMETER IS LARGER THAN MALE-SCREW DIAMETER | — | NO INTERFERENCE /NO CONTACT | |
| TAPPED HOLE NOT CREATED | | INTERFERENCE | INTERFERENCE | |
| NO TAPPED-HOLE MODEL FOR MALE SCREW | | NO INTERFERENCE AND NO CONTACT | | |
| NORMAL RELATIONSHIP BETWEEN MALE SCREW AND TAPPED HOLE | | INTERFERENCE | CONTACT | |

FIG. 19A
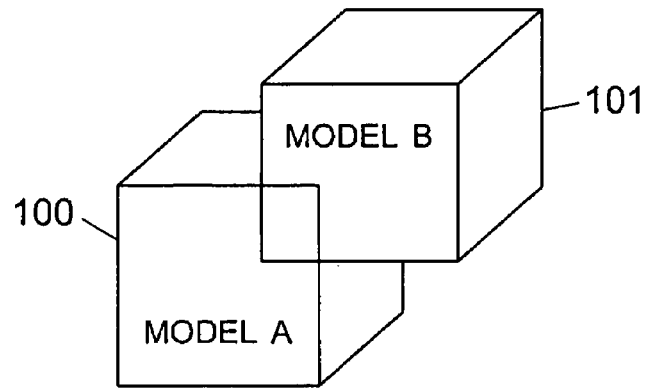
FIG. 19B
| No | MODEL 1 | MODEL 2 | MODE |
|---|---|---|---|
| 1. | MODEL A | MODEL B | INTERFERENCE |
FIG. 20A
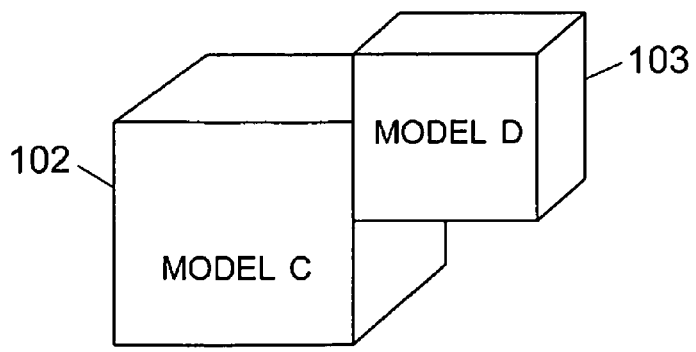
FIG. 20B
| No | MODEL 1 | MODEL 2 | MODE |
|---|---|---|---|
| 1. | MODEL C | MODEL D | CONTACT |

APPARATUS AND METHOD FOR VERIFYING MODEL-DESIGN, AND PROGRAM THEREOF

CROSS-REFERENCE TO RELATED APPLICATIONS

This application claims the conventional priority based on Japanese patent application serial No. 2006-029444, filed on Feb. 7, 2006, the disclosures of which are incorporated herein by reference.

BACKGROUND OF THE INVENTION

1. Field of the Invention

The present invention generally relates to an apparatus and method for verifying model-design and a model-design verification program for checking models designed using a 3D-CAD system, and particularly to an apparatus and method for verifying model-design and a model-design verification program for verifying the fits between male-screw models and tapped-hole models that are designed using a 3D-CAD system.

2. Description of the Related Art

As design systems have become more and more complex every year, a method is required in which, in order to eliminate design errors, defects in designing are readily extracted on a 3D-CAD system.

FIG. 18 is a flowchart illustrating a flow of a conventional design using a 3D-CAD system. After designing models on the 3D-CAD system (in the step S101), defects in designed models are extracted by implementing an interference check that is a main function of the 3D-CAD system (in the step S102). Thereafter, the extracted defects are modified (in the step S103). As described above, by modifying defects at a designing stage, design errors can be prevented from leaking into production and the like.

The foregoing interference-check function is provided as a standard feature, in a 3D-CAD system such as the One Space Designer (supplied by CoCreate Software, Inc.), the Pro/ENGINEER (supplied by Parametric Technology Corporation), or the Solid/MX (supplied by Fujitsu Limited).

By implementing interference checks, information can be obtained that suggests that (1) interference occurs between which models, (2) contact occurs between which models, and the like. Based on the information, the CAD user extracts design errors.

FIGS. 19A, 19B, 20A, and 20B are diagrams representing an interference check implemented between models. For example, in the case where an interference check is implemented between a model A 100 and a model B 101 shown in FIG. 19A and both the models interfere with each other, an interference-check result, for example, a table represented in FIG. 19B, is created. Additionally, in the case where, as represented in FIG. 20A, a model C 102 and a model D 103 come into contact with each other, an interference-check result, for example, a table represented in FIG. 20B, is created.

Additionally, Japanese Patent Laid-Open No. 2005-233911 discloses a female-screw inspection jig for detecting a female screw misaligned with respect to the center axis of a prepared hole formed using a drill.

When created in 3-dimensional model, female screws (tapped holes) are often created so as to have a prepared-hole diameter, considering CAM (Computer Aided Manufacturing) coordination and representation by two-dimensional drawing. That is because, in the case where CAM coordination is implemented, information on the drill diameter is required to be handed over to the CAM system and, if the female-screw portion is created so as to have a screw diameter, the diameter is required to be changed from the screw diameter to a prepared-hole diameter (the drill diameter).

Additionally, in the case where a female screw is represented by a two-dimensional drawing, it is known that the screw-diameter portion and the prepared-hole portion are represented by a thin line and a thick line, respectively. For example, a screw-diameter portion 300 and a prepared-hole portion 301 of a female screw illustrated in FIGS. 21A and 21B by two-dimensional drawings are represented by a thin line and a thick line, respectively. In FIG. 21B, a symbol D1 denotes a prepared-hole diameter and a symbol D2 denotes a screw diameter.

In this situation, when a two-dimensional drawing is automatically created from a 3D model, the outline of the 3D model is created by a thick line. Because, if a screw hole is created so as to have a screw diameter, the screw-diameter portion is represented by a thick line, in an automatically created two-dimensional drawing (the prepared-hole line is manually added to the two-dimensional drawing), the line representing the screw-diameter portion is required to be changed from the thick line to a thin line. Accordingly, in the case where female screws (tapped holes) are created in the 3-dimensional model, the female-screw portions are often created so as to have a prepared-hole diameter.

In the case where, in a 3D model, a female-screw portion is created so as to have a prepared-hole diameter, the prepared-hole portion in a two-dimensional drawing is created by means of a thick line. Therefore, it is not necessary to modify the prepared-hole portion. The thin line indicating a screw diameter is required to be manually added to a two-dimensional drawing. However, in the OneSpaceDesigner (a 3D-CAD system supplied by CoCreate Software, Inc.), by creating a female screw so as to have a prepared-hole diameter and providing the screw with a screw attribute (for example, a screw-diameter), a thin line indicating the screw diameter can automatically be added to the female-screw portion in a two-dimensional drawing.

Additionally, in the case of a male-screw model, the screw diameter in a two-dimensional drawing is required to be created by a thick line, and the 3D model is often created so as to have a screw diameter.

In the case where a female screw is created so as to have a prepared-hole diameter and a male screw is created so as to have a screw diameter, an interference check on the 3D model results in an output indicating that interference exists in the portion (a normal portion) between the male-screw model and the female-screw model (tapped-hole model). That is because the male-screw model and the tapped-hole model are created so as to have a screw diameter and a prepared-hole diameter, respectively.

A CAD user implements a check on the 3D model, based on the foregoing interference information. However, it is necessary to check manually whether the interference portion is the portion (normal portion) between the male screw and the tapped hole or a portion (problem portion) between general models, whereby the check work requires a great number of man-hours.

Although a function or a method is conceivable in which an interference check is implemented, with male screws excluded as non-object components. However, in this case, the interference (problem portion) between a male screw and a general model as well as the interference between a male screw and a tapped hole is also excluded, whereby a problem occurs in which some problem portions are not found.

SUMMARY OF THE INVENTION

It is an object of the present invention to provide an apparatus for verifying model-design which automatically checks the fit between a male-screw model and a tapped-hole model that are designed using a 3D-CAD system.

It is another object of the present invention to provide a method for verifying model-design which automatically checks the fit between a male-screw model and a tapped-hole model that are designed using a 3D-CAD system.

It is still another object of the present invention to provide a program for verifying model-design which automatically checks the fit between a male-screw model and a tapped-hole model that are designed using a 3D-CAD system.

The present invention provides an apparatus for verifying model-design which verifies design of a 3D model. The apparatus comprises an interference check unit implementing interference check on relationship between a male-screw model and a tapped-hole model, both of which are included in the 3D model, for each case where a tapped-hole diameter of the tapped-hole model is a prepared-hole diameter and where a tapped-hole diameter of the tapped hole model is a screw diameter, and a model-fit verification unit verifying fit between the male-screw model and the tapped-hole model based on the result of the interference check.

Preferably, the apparatus according to the present invention further comprises a tapped-hole-diameter changing unit changing to the screw diameter the tapped-hole diameter of the tapped-hole model that interferes with the male-screw model when the result of the interference check by the interference check unit in the case where the tapped-hole diameter of the tapped-hole model is the prepared-hole diameter indicates any interference.

Preferably, the apparatus according to the present invention further comprises an interference-check-result analysis unit analyzing whether or not any model other than the tapped-hole model comes into contact with the male-screw model based on the result of interference check by the interference check unit. The model-fit verification unit determines that the design of the 3D model is defective when the result of analysis by the interference-check-result analysis unit indicates that no model interferes with the male-screw model.

The present invention provides a method for verifying model-design which verifies design of a 3D model. The method comprises implementing interference check on relationship between a male-screw model and a tapped-hole model, both of which are included in the 3D model, for each case where a tapped-hole diameter of the tapped-hole model is a prepared-hole diameter and where a tapped-hole diameter of the tapped hole model is a screw diameter, and verifying fit between the male-screw model and the tapped-hole model based on the result of the interference check.

The present invention provides a program for verifying model-design which verifies design of a 3D model. The program causes a computer to execute implementing interference check on relationship between a male-screw model and a tapped-hole model, both of which are included in the 3D model, for each case where a tapped-hole diameter of the tapped-hole model is a prepared-hole diameter and where a tapped-hole diameter of the tapped hole model is a screw diameter, and verifying fit between the male-screw model and the tapped-hole model based on the result of the interference check.

With the apparatus, method, and program for verifying model-design according to the present invention, the check on the fit between a male-screw model and a tapped-hole model, which has been implemented by a CAD user, can be automatically implemented. Therefore, the man-hours for checking the fit between male-screw models and tapped-hole models can significantly be reduced.

Moreover, with the apparatus, method, and program for verifying model-design according to the present invention, by automatically checking the fit between a male-screw model and a tapped-hole model, the defect in the fit between a male-screw model and a tapped-hole model can securely be extracted. Therefore, according to the present invention, design errors can be prevented.

BRIEF DESCRIPTION OF THE DRAWINGS

FIG. 2 is a flowchart illustrating an example of a processing flow for checking the fit between a male-screw model and a tapped-hole model.

FIG. 3 is a flowchart illustrating an example of a processing flow for saving a 3D model initial status.

FIG. 4 is a flowchart illustrating an example of a processing flow for sorting interference-check results into interference information related to male-screw models and the other interference information.

FIGS. 6A to 6C are diagrams illustrating interference information related to male-screw models, information for interferences between general models (other than screws), and interference information for each male-screw model.

FIG. 13 is a table representing an example of defective relationships between a male screw and a tapped hole and interference-check results in the case where the diameter of the tapped hole is changed to a screw diameter.

FIG. 14 is a flowchart illustrating an example of a processing flow for returning the 3D model to the initial status.

FIG. 16 is a table representing an example of the result of an interference check, for each relationship between a male screw and a tapped hole, on the relationship between a male-screw model and a tapped-hole model.

FIGS. 19A and 19B are diagrams illustrating an interference check between models.

FIGS. 20A and 20B are diagrams illustrating an interference check between models.

DETAILED DESCRIPTION OF THE PREFERRED EMBODIMENTS

In an embodiment of the present invention, the fit between a male-screw model and a tapped-hole model is checked according to the following procedure.

(1) A male-screw model and a tapped-hole model are extracted from a 3D model designed through a 3D-CAD. A male-screw model created so as to have a screw diameter is utilized. For both cases where a tapped hole is represented by means of a prepared-hole diameter and the tapped hole is represented by means of a screw diameter, an interference check on the male-screw model is implemented.

(2) By analyzing information on the result of the interference check, the relationship between the male-screw model and the tapped-hole model is checked.

For example, in the case where the relationship between the male-screw model and the tapped-hole model is normal, when the tapped hole is represented by means of a prepared-hole diameter, the male-screw model cannot be driven into the tapped-hole model. Therefore, the result of the interference check implemented between the male-screw model and the tapped-hole mode indicates "interference". When the tapped hole is represented by means of a screw diameter, the male-screw model can be driven into the tapped-hole model. Therefore, the result of the interference check implemented between the male-screw model and the tapped-hole mode indicates "contact".

Figure 15A:
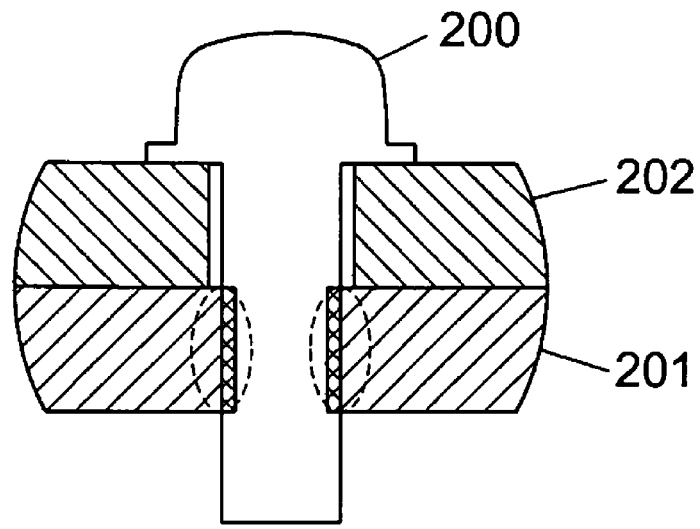
FIGS. 15A and 15B are diagrams illustrating the relationship between a male-screw model and a tapped-hole model.

FIG. 15A is a diagram illustrating the relationship between a male-screw model and a tapped-hole model when the tapped hole is represented by means of a prepared-hole diameter. In FIG. 15A, reference numeral 200 denotes a male-screw model, reference numeral 201 denotes a tapped-hole model, and reference numeral 202 denotes a clearance-hole model. The clearance-hole model 202 is a model fixed by the male-screw model 200. The male-screw model 200 is created so as to have a screw diameter and the tapped-hole model 201 is created so as to have a prepared-hole diameter. Therefore, when the relationship between the male-screw model 200 and the tapped-hole model 201 is normal, the male-screw model 200 and the tapped-hole model 201 interfere with each other, in the screw fitting portions that are encircled by dotted-line ellipsoids in FIG. 15A.

Figure 15B:
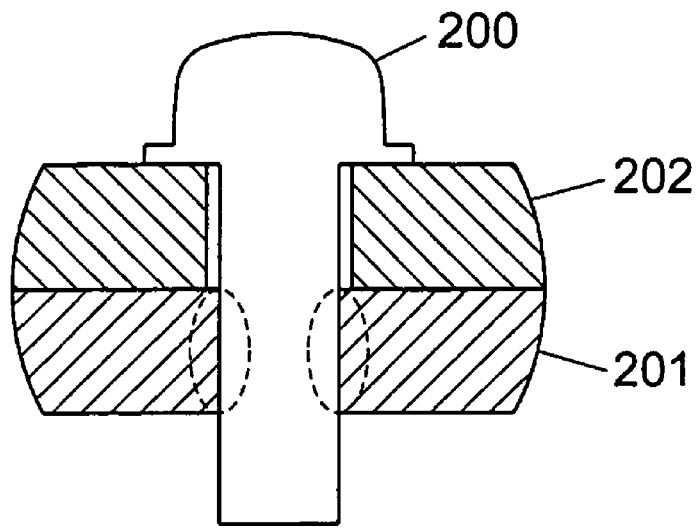

FIG. 15B is a diagram illustrating the relationship between a male-screw model and a tapped-hole model when the tapped hole is represented by means of a screw diameter. The male-screw model 200 and the tapped-hole model 201 are created so as to have a screw diameter. Therefore, when the relationship between the male-screw model 200 and the tapped-hole model 201 is normal, the male-screw model 200 and the tapped-hole model 201 are in contact with each other, in the screw fitting portions that are encircled by dotted-line ellipsoids.

Accordingly, in the embodiment of the present invention, when, in the case where a tapped hole is represented by means of a prepared-hole diameter, the result of an interference check is "interference", and when, in the case where the tapped hole is represented by means of a screw diameter, the result of an interference check is "contact", it is determined that the fit between the male-screw model and the tapped hole is not defective. Otherwise, it is determined that the fit between the male-screw model and the tapped hole is defective.

FIG. 16 is a table representing an example of the result of an interference check, for each relationship between a male screw and a tapped hole, on the relationship between a male-screw model and a tapped-hole model. The interference-check result in FIG. 16 represents each of cases where the tapped-hole diameter is represented by means of a prepared-hole diameter and the tapped-hole diameter is represented by means of a screw diameter.

For example, when the male screw and the tapped hole are misaligned, or when the tapped-hole diameter is smaller than the male-screw diameter, or when the tapped-hole diameter is larger than the male-screw diameter, the fit between a male screw and a tapped hole is defective.

As represented in FIG. 16, when the male screw and the tapped hole are misaligned, the interference-check result is "interference", for both cases where the tapped hole is represented by means of a prepared-hole diameter and the tapped hole is represented by means of a screw diameter. When the tapped-hole diameter is smaller than the male-screw diameter, the same result as the foregoing result is obtained.

Figure 17A:
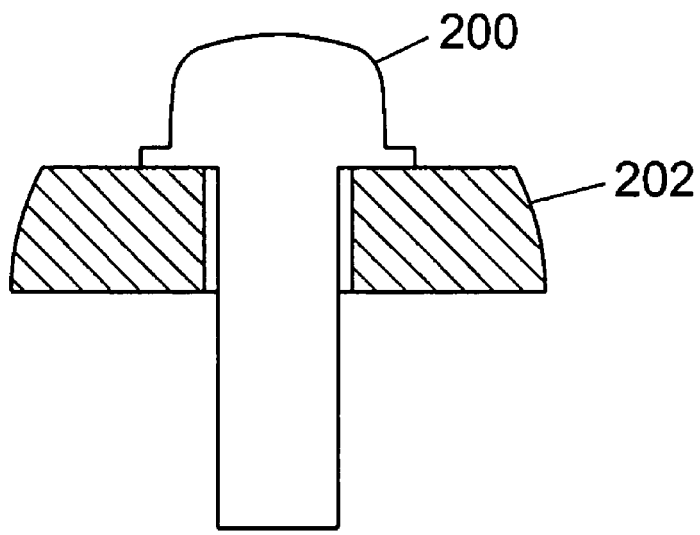
FIGS. 17A and 17B are diagrams illustrating an example of the result of an interference check implemented between a male-screw model and a tapped-hole model.
Figure 17B:
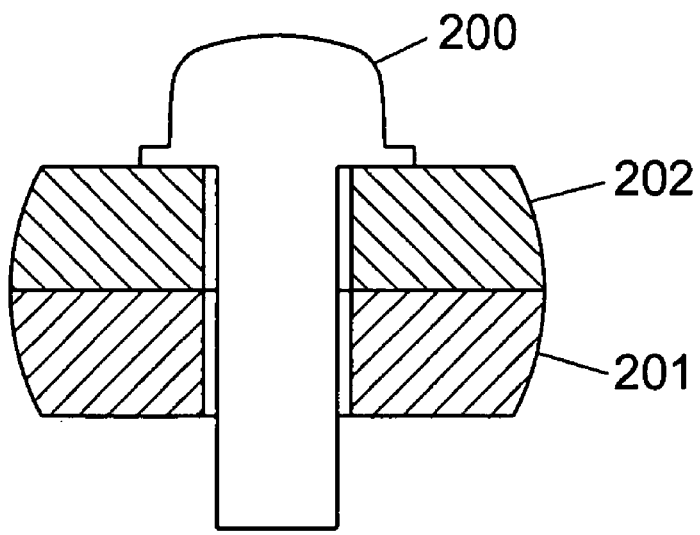
Figure 18:
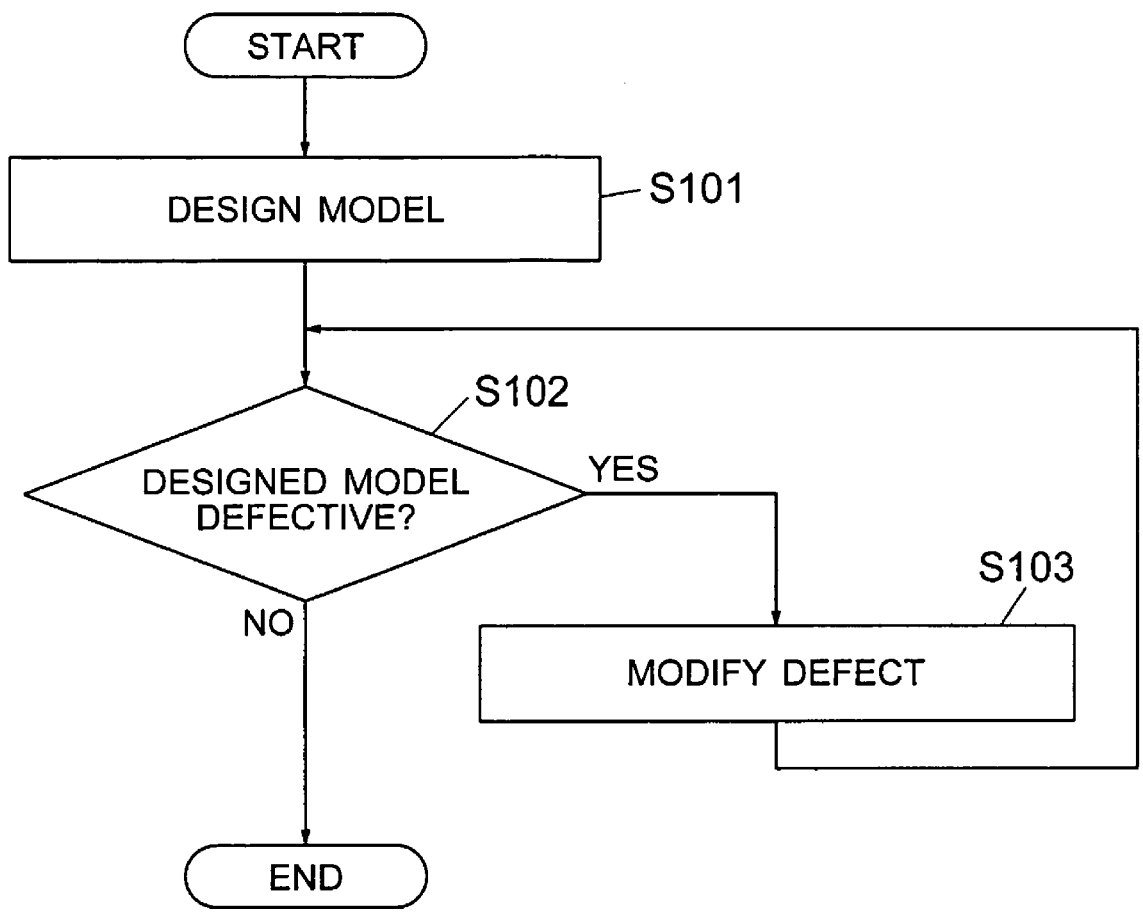
FIG. 18 is a flowchart illustrating a flow of a conventional design using a 3D-CAD system.
Figure 21A:
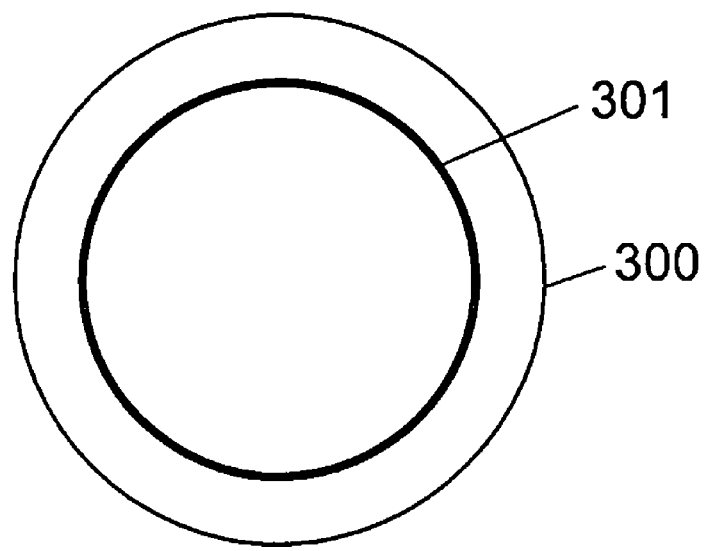
FIGS. 21A and 21B are diagrams illustrating a male screw represented in a two-dimensional screen.
Figure 21B:
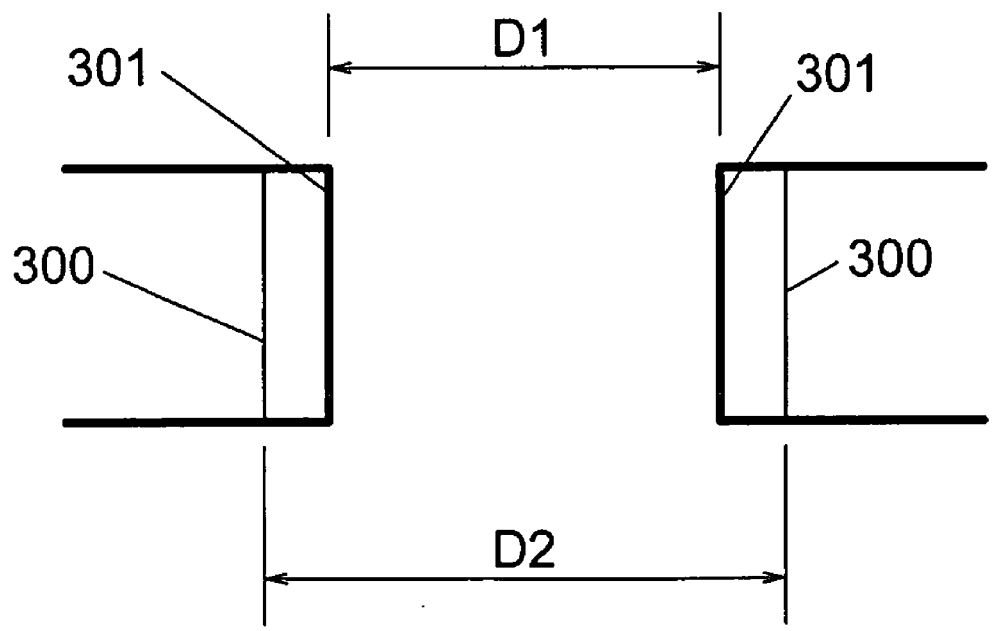

Additionally, for example, as represented in FIG. 17B, when the tapped-hole diameter of the tapped-hole model 201 is larger than the diameter of the male-screw model 200 and the tapped-hole is represented by means of a screw diameter, the male screw and the tapped hole neither interfere with each other nor come into contact with each other. Therefore, the interference-check result is "no interference and no contact". In contrast, when the tapped hole is represented by means of a prepared-hole diameter, the interference-check result is unspecified. That is because, in the case where the prepared-hole diameter of the tapped hole is larger than the screw diameter of the male screw, the male screw and the tapped hole neither interfere with each other nor come into contact with each other, but the male screw and the tapped hole interfere with each other in the case where the prepared-hole diameter of the tapped hole is smaller than the screw diameter of the male screw.

When no tapped hole exists for the male screw, for example, in the case where no tapped hole is created, the interference-check result is "interference", for both cases where the tapped hole is represented by means of a prepared-hole diameter and the tapped hole is represented by means of a screw diameter.

Additionally, for example, as represented in FIG. 17A, when no tapped-hole model exists for the male-screw model 200, the interference-check result is "no interference and no contact", for both cases where the tapped hole is represented by means of a prepared-hole diameter and the tapped hole is represented by means of a screw diameter.

Additionally, when the relationship between the male screw and the tapped hole is normal, the interference-check result is "interference" in the case where the tapped hole is represented by means of a prepared-hole diameter and the interference-check result is "contact" in the case where the tapped hole is represented by means of a screw diameter.

Figure 1:
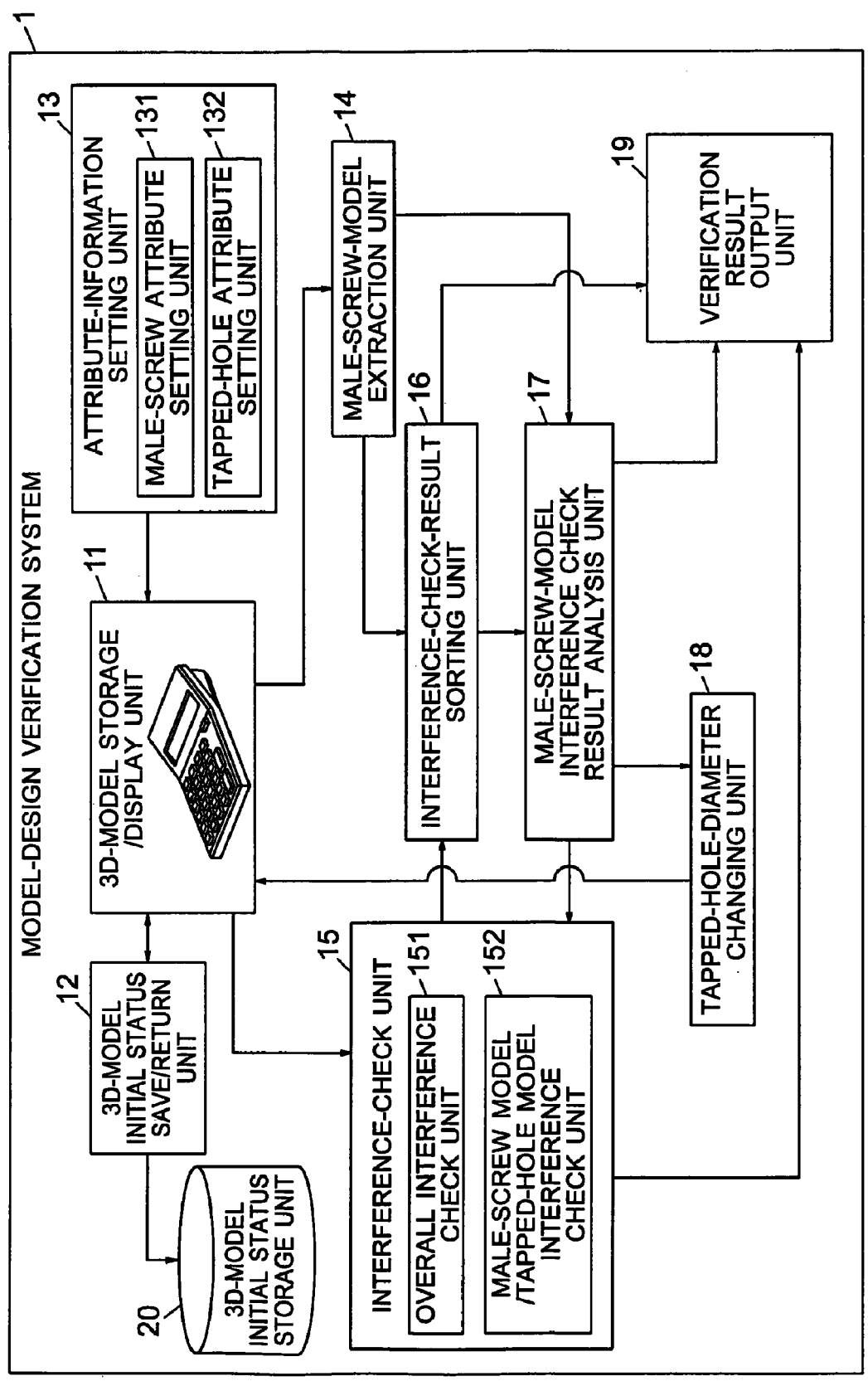
FIG. 1 is a block diagram illustrating an example of a structure of an apparatus for verifying model-design according to the present invention.

FIG. 1 is a block diagram illustrating an example of a structure of an apparatus for verifying model-design according to the present invention. A model-design verification system 1 is an apparatus for verifying model-design according to the present invention. A model-design verification system 1 is a processing system for verifying 3D-model design, by checking a fit between a male-screw model and a tapped-hole model in the 3D-model.

The model-design verification system 1 includes a 3D-model storage/display unit 11, a 3D-model initial status save/return unit 12, an attribute-information setting unit 13, a male-screw-model extraction unit 14, an interference-check unit 15, an interference-check-result sorting unit 16, a male-screw-model interference check result analysis unit 17, a tapped-hole-diameter changing unit 18, a verification result output unit 19, and a 3D-model initial status storage unit 20.

The 3D-model storage/display unit 11 stores and displays a 3D model designed through a 3D-CAD. For example, as illustrated in FIG. 1, the 3D-model storage/display unit 11 stores and displays a 3D model of an electronic calculator.

The 3D-model initial status save/return unit 12 saves in the 3D-model initial status storage unit 20 the 3D model in the 3D-model storage/display unit 11 and makes the 3D-model initial status storage unit 20 store the 3D model. Moreover, the 3D-model initial status save/return unit 12 loads on the 3D-model storage/display unit 11 the 3D model stored in the 3D-model initial status storage unit 20, thereby returning the 3D model to its initial status.

The attribute-information setting unit 13 sets attribute information for each male-screw model of the 3D model in the 3D-model storage/display unit 11. Additionally, the attribute-information setting unit 13 sets attribute information for each tapped-hole model in the 3D model. For example, as described later, the attribute-information setting unit 13 creates tapped holes so as to have a prepared-hole diameter and sets respective information on the screw diameter corresponding to the created tapped holes.

The male-screw-model extraction unit 14 extracts male-screw models from a 3D model in the 3D-model storage/display unit 11. The male-screw-model extraction unit 14 extracts male-screw models from the 3D model, for example, based on attribute information on the male-screw models set by the attribute-information setting unit 13 described later. The interference-check unit 15 implements an interference check on a 3D model in the 3D-model storage/display unit 11. In other words, the interference-check unit 15 implements not only an interference check on the entire 3D model but also a check on interference between a male-screw model and a tapped-hole model, after the tapped-hole diameter is modified by the tapped-hole-diameter changing unit 18 described later.

Utilizing the result of extraction, by the male-screw-model extraction unit 14, of male-screw models, the interference-check-result sorting unit 16 sorts the result of the interference check on the entire 3D model implemented by the interference-check unit 15 into the interference-check results related to male-screw models and the interference-check results related to other models.

The male-screw-model interference check result analysis unit 17 analyzes whether or not any model exists that interferes or comes into contact with a male-screw model, based on the interference-check results related to male-screw models. For example, the male-screw-model interference check result analysis unit 17 determines whether or not any model exists that comes into contact with a male-screw model, based on the interference information related to male-screw models. Additionally, for example, the male-screw-model interference check result analysis unit 17 determines whether or not any model exists that interferes or comes into contact with a male-screw model, based on the interference information, related to male-screw models, that are obtained through processing by the interference-check-result sorting unit 16.

When the male-screw-model interference check result analysis unit 17 determines that a model that interferes with a male-screw model exists, the tapped-hole-diameter changing unit 18 anticipates that the model that interferes with the male-screw model is a tapped-hole model. Additionally, the tapped-hole-diameter changing unit 18 changes to the screw diameter the tapped-hole diameter of the model that has been anticipated to be a tapped-hole model. For the change of a tapped-hole diameter, for example, screw-diameter information that are set by the attribute-information setting unit 13 described later for tapped-hole models are utilized. Through processing by the tapped-hole-diameter changing unit 18, the tapped-hole diameter of each male-screw model that may be included in the 3D model in the 3D-model storage/display unit 11 is changed.

The verification result output unit 19 outputs the result of a check on the fit between a male-screw model and a tapped-hole model. For example, when the analysis by the male-screw-model interference check result analysis unit 17 results in the determination that no model that comes into contact with a male-screw model exists, the verification result output unit 19 outputs an NG message indicating that the 3D-model design is defective. Additionally, for example, when the analysis by the male-screw-model interference check result analysis unit 17 results in the determination that no model that interferes with a male-screw model exists, the verification result output unit 19 outputs an NG message indicating that the 3D-model design is defective. Additionally, for example, when the interference-check unit 15 determines that, after the tapped-hole diameter is changed, a male-screw model and a tapped-hole model interfere with each other, the verification result output unit 19 outputs an NG message. The 3D-model initial status storage unit 20 stores the initial status of a 3D model.

The attribute-information setting unit 13 and the interference-check unit 15 will be explained further. The attribute-information setting unit 13 includes a male-screw attribute setting unit 131 and a tapped-hole attribute setting unit 132. The male-screw attribute setting unit 131 sets attributes for a male-screw model. The tapped-hole attribute setting unit 132 creates the tapped holes of tapped-hole models in a 3D model in the 3D-model storage/display unit 11 so as to have a prepared-hole diameter and sets, as the attributes for the tapped-hole models, respective information on the screw diameter corresponding to the created tapped holes. In the embodiment of the present invention, the tapped-hole attribute setting unit 132 creates tapped holes so as to have a prepared-hole diameter, by utilizing the tapped-hole creation function of OneSpaceDesigner (the 3D-CAD designer supplied by CoCreate) and sets respective information on the screw diameter corresponding to the created tapped holes.

The interference-check unit 15 includes an overall interference check unit 151 and a male-screw model/tapped-hole model interference check unit 152. The overall interference check unit 151 implements an interference check on an entire 3D model. The male-screw model/tapped-hole model interference check unit 152 implements a check on the interferences between respective male-screw models and tapped-hole models included in a 3D model. The male-screw model/tapped-hole model interference check unit 152, for example, implements a check on the interference between a male-screw model that has been determined, by the male-screw-model interference check result analysis unit 17, to have an interfering model and a tapped-hole model whose tapped-hole diameter has been changed to its screw diameter, by the tapped-hole-diameter changing unit 18.

FIG. 2 is a flowchart illustrating an example of a flow in check processing for the fit between a male-screw model and a tapped-hole model. In check processing, in the embodiment of the present invention, for the fit between a male-screw model and a tapped-hole model, a male-screw model is created so as to have a screw diameter, and a tapped-hole model is created so as to have a prepared-hole diameter.

In the first place, the model-design verification system 1 saves the initial status of a 3D model (in the step S1). For example, the model-design verification system 1 stores in the 3D-model initial status storage unit 20 a 3D model that has not received any interference check. The model-design verification system 1 implements interference checks and then sorts the interference-check results into interference information related to male-screw models and the other interference information (in the step S2). Next, the model-design verification system 1 extracts the model that interferes or comes into contact with each male-screw model (in the step S3).

The model-design verification system 1 outputs a message for the respective models that come into contact with the male-screw models (in the step S4). Additionally, with regard to models that interfere with the male-screw models, after changing the tapped-hole diameter of the models that interfere with the male-screw models, the model-design verification system 1 implements interference checks again, and determines whether or not the screw fitting portions is good (in the step S5). In other words, after changing to the screw diameter the tapped-hole diameter of the models that interfere with the male-screw models, based on the interference-check results for respective male-screw models, the model-design verification system 1 implements interference checks again, thereby determining whether or not the screw fitting portion is good.

Thereafter, the model-design verification system 1 returns the 3D model to its initial status (in the step S6). For example, after erasing a 3D model in the 3D-model storage/display unit 11, the model-design verification system 1 loads on the 3D-model storage/display unit 11 the 3D model that has been saved in the 3D-model initial status storage unit 20. Through the processing in the step S6, a 3D model can readily be returned to its initial status.

FIG. 3 is a flowchart illustrating an example of a processing flow for saving a 3D model initial status. The model-design verification system 1 sets the attributes of screw models in a 3D model (in the step S11). For example, for male-screw models in a 3D model of an electronic calculator illustrated in FIG. 5A, the model-design verification system 1 sets identifiers for uniquely identifying the male-screw models.

Figures 5A, 5B, 5C:
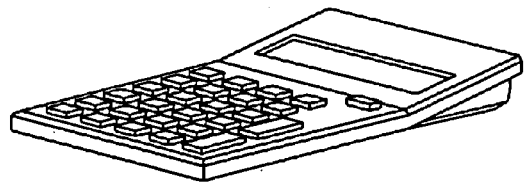
FIGS. 5A to 5C are diagrams illustrating a 3D model, male-screw models, and results of interference checks on the entire 3D model.

Additionally, in the step S11, the model-design verification system 1 creates, for example, tapped holes in a 3D model of the electronic calculator illustrated in FIG. 5A so as to have a prepared-hole diameter, and sets as attributes of the tapped-hole models respective information on the screw diameter corresponding to the created tapped holes.

While most of screw models are standard products and often extracted from 3D-Library (unillustrated in FIG. 1), by setting attributes for screw models, man-hours for a designer to give the attributes can be reduced, and it is possible to prevent a designer from forgetting to set the attributes.

Next, the model-design verification system 1 saves the initial status of the 3D model for which the attributes of the screw models have been set in the 3D-model initial status storage unit 20 (in the step S12).

FIG. 4 is a flowchart illustrating an example of a processing flow for sorting interference-check results into interference information related to male-screw models and the other interference information. The model-design verification system 1 extracts male-screw models from a 3D model (in the step S21). In other words, by checking the attributes of male-screw models, the model-design verification system 1 automatically extracts the male-screw models from the 3D model in the 3D-model storage/display unit 11.

For example, the model-design verification system 1 extracts four male-screw models (screw models A to D) illustrated in FIG. 5B from a 3D model of an electronic calculator illustrated in FIG. 5A.

Thereafter, the model-design verification system 1 implements an interference check on the entire 3D model (in the step S22). Through the interference check in the step S22, an interference-check result for the entire 3D model, as represented in FIG. 5C for example, can be obtained.

When the interference-check in the step S22 brings about interference-check results related to the male-screw models (in the step S23), the model-design verification system 1 sorts the interference-check results for each male-screw model (in the step S24). For example, the model-design verification system 1 extracts the interference-check results related to the four male-screw models represented in FIG. 5B from the interference-check results on the entire 3D model represented in FIG. 5C, thereby obtaining interference information related to the male-screw models as represented in FIG. 6A. Additionally, the model-design verification system 1 creates interference information for each male-screw model as represented in FIG. 6C based on the interference information represented in FIG. 6A.

When the interference-check in the step S22 brings about interference-check results unrelated to the male-screw models, the model-design verification system 1 outputs information on the interferences between general models (other than screws) (in the step S25). For example, the model-design verification system 1 obtains interference information as represented in FIG. 6B which is unrelated to the male-screw models from the interference-check results on the entire 3D model as represented in FIG. 5C, and outputs the interference information.

Through the processing implemented in the steps S21 to S25, the interference-check results can be sorted into the interference information related to male-screw models and the interference information unrelated to the male-screw models. Therefore, with the information on the interferences between the male-screw models and the tapped-hole models removed, the information on the interferences between general models (other than screw models) can be outputted.

Figure 7:
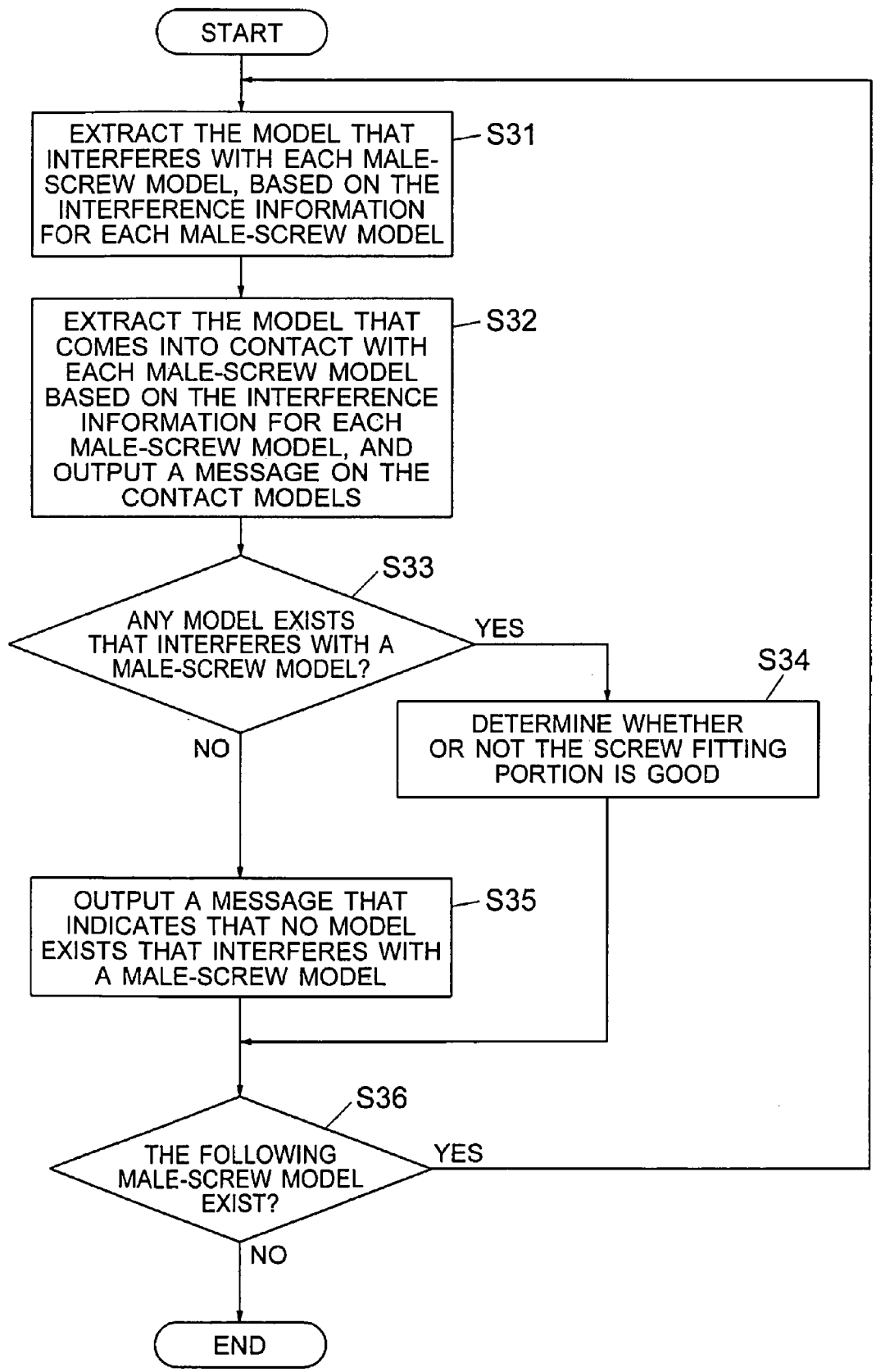
FIG. 7 is a flowchart illustrating an example of a processing flow for extracting respective models that interfere or come into contact with male-screw models.

FIG. 7 is a flowchart illustrating an example of a processing flow for extracting respective models that interfere or come into contact with male-screw models. The model-design verification system 1 extracts the model that interferes with each male-screw model based on the interference information for each male-screw model (in the step S31). Additionally, the model-design verification system 1 extracts the model that comes into contact with each male-screw model based on the interference information for each male-screw model, and outputs a message on the contact models (in the step S32). The details of output processing for the message on contact models will be described later. Next, the model-design verification system 1 determines whether or not any model exists that interferes with a male-screw model (in the step S33), determines whether or not the screw fitting portion is good (in the step S34) in the case where a model exists that interferes with a male-screw model, and proceeds to the step S36. The processing of determining whether or not the screw fitting portion is good will be described later with reference to FIG. 11. When no model exists that interferes with a male-screw model, the model-design verification system 1 outputs a message that indicates that no model exists that interferes with a male-screw model (in the step S35). In the case where the following male-screw model exists (in the step S36), the model-design verification system 1 returns to the step S31. In the case where the following male-screw model does not exist, the model-design verification system 1 ends the processing.

Figure 8:
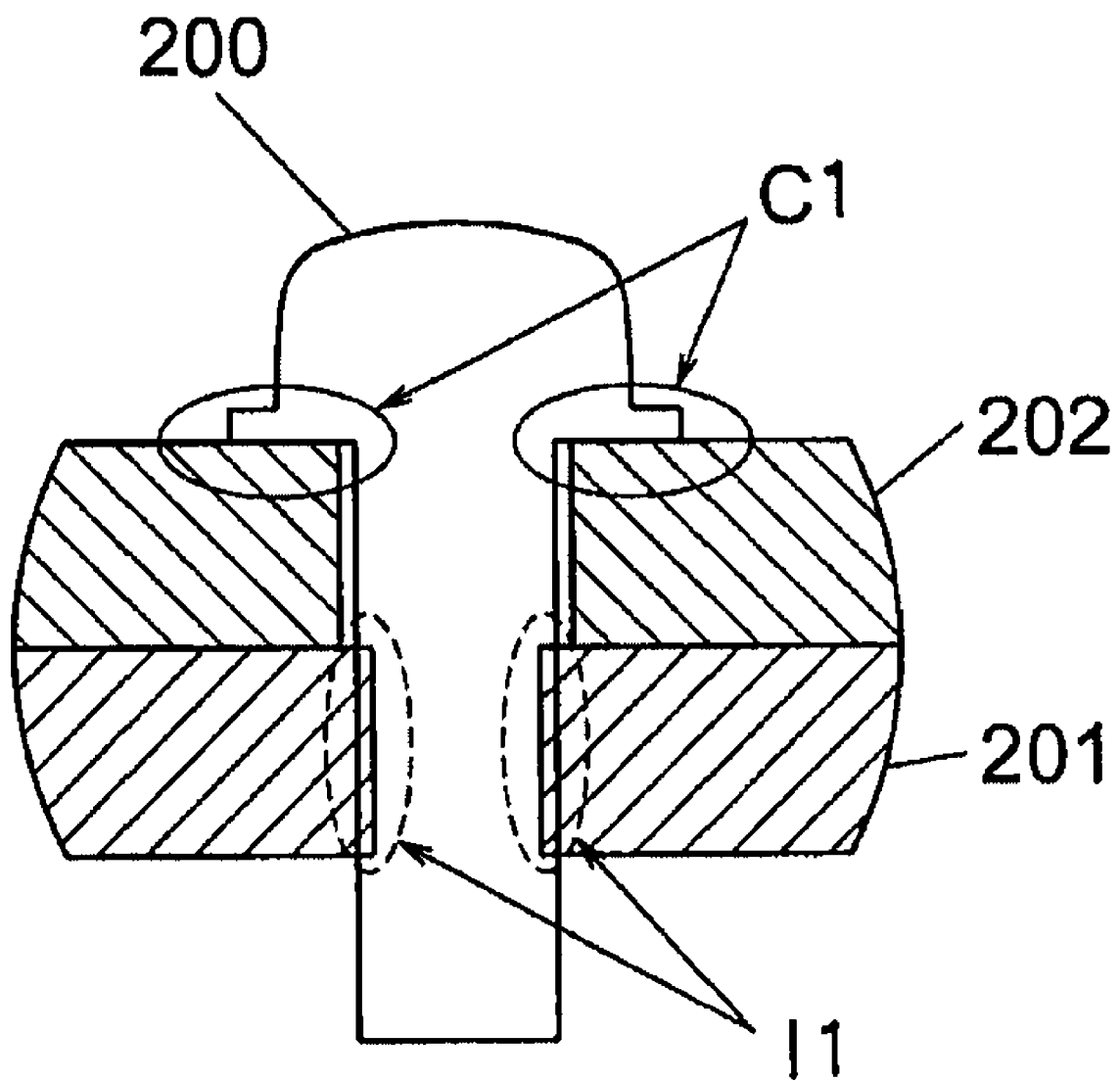
FIG. 8 is a diagram illustrating the interference between a male-screw model and a tapped-hole model.

In the case where the tapped-hole diameter is created so as to have a prepared-hole diameter, for example, as denoted by symbol I1 shown in FIG. 8, the male-screw model 200 and the tapped-hole model 201 interfere with each other in the screw fitting portions that are encircled by dotted-line ellipsoids. Accordingly, by extracting the model that interferes with a male-screw model, according to the processing flow illustrated in FIG. 7, a tapped-hole model can be anticipated. Additionally, as long as a screw function is retained, the clearance-hole model that is fixed to a tapped-hole model definitely exists and the clearance-hole model comes into contact with the male-screw model. For example, as denoted by a symbol C1 shown in FIG. 8, the male-screw model 200 and the clearance-hole model 202 come into contact with each other in the portions that are encircled by solid-line ellipsoids. Accordingly, by extracting the model that comes into contact with a male-screw model according to the processing flow illustrated in FIG. 7, a clearance-hole model can be anticipated.

Figure 9:
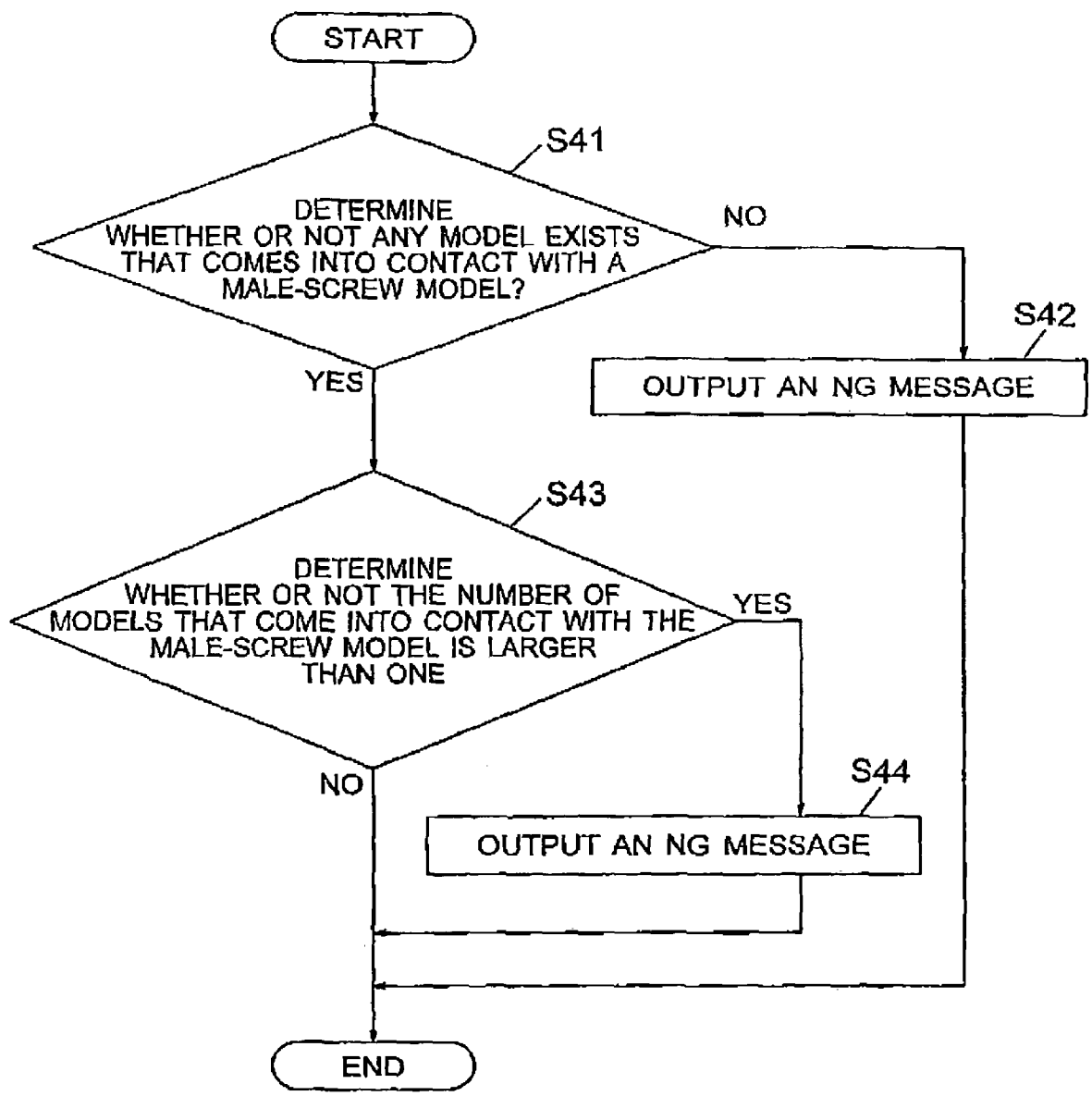
FIG. 9 is a flowchart illustrating an example of a processing flow for outputting a message on a model that comes into contact with a male-screw model.
Figure 10:
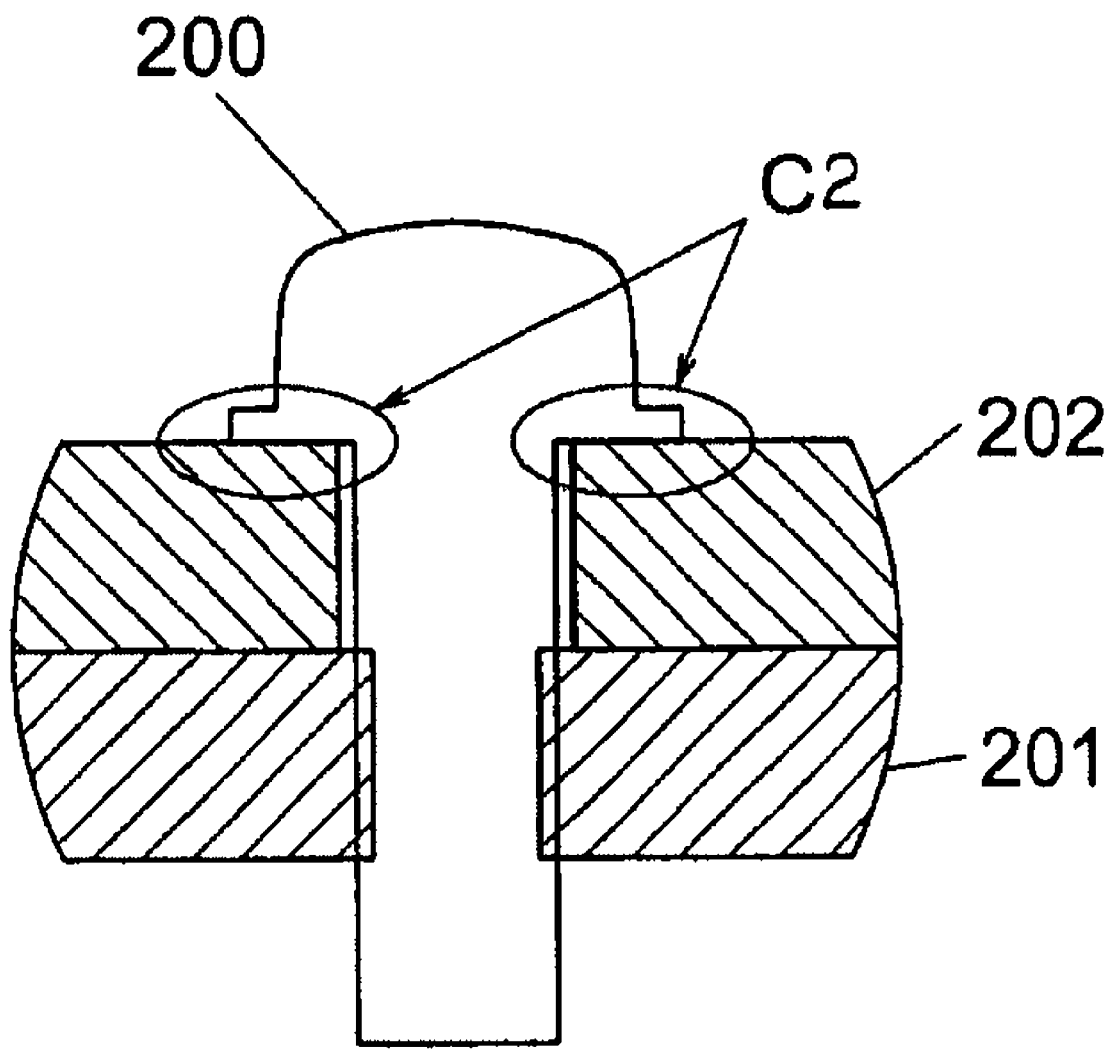
FIG. 10 is a diagram illustrating the contact between a male-screw model and a clearance-hole model.

FIG. 9 is a flowchart illustrating an example of a processing flow for outputting a message on a model that comes into contact with a male-screw model. The role of a male-screw model is to fix a clearance-hole model to a tapped-hole model. In general, for a male-screw model, only a single clearance-hole model exists that comes into contact with the male-screw model. For example, as denoted by a symbol C2 shown in FIG. 10, the male-screw model 200 has only a single clearance-hole model that comes into contact therewith. Thus, as explained below, by checking the number of models that come into contact with a male-screw model, it can be ascertained whether or not the male-screw model plays the role as a screw.

In the first place, the model-design verification system 1 determines whether or not any model exists that comes into contact with a male-screw model (in the step S41). For example, by referring to interference information, as represented in FIG. 6C, for each male-screw model, the model-design verification system 1 determines whether or not any model exists that comes into contact with the male-screw model which is the present processing-object. In the case where no model exists that comes into contact with the male-screw model, the model-design verification system 1 outputs an NG message (in the step S42). For example, a message such as "no clearance-hole model exists that corresponds to the male screw" is outputted. In the case where any model exists that comes into contact with the male-screw model, the model-design verification system 1 determines whether or not the number of models that come into contact with the male-screw model is larger than one (in the step S43). In the case where the number of models that come into contact with the male-screw model is one or smaller, the model-design verification system 1 ends the processing. In the case where the number of models that come into contact with the male-screw model is larger than one, the model-design verification system 1 outputs an NG message (in the step S44). For example, a message such as "models exist that come into contact with the male screw" is outputted.

Figure 11:
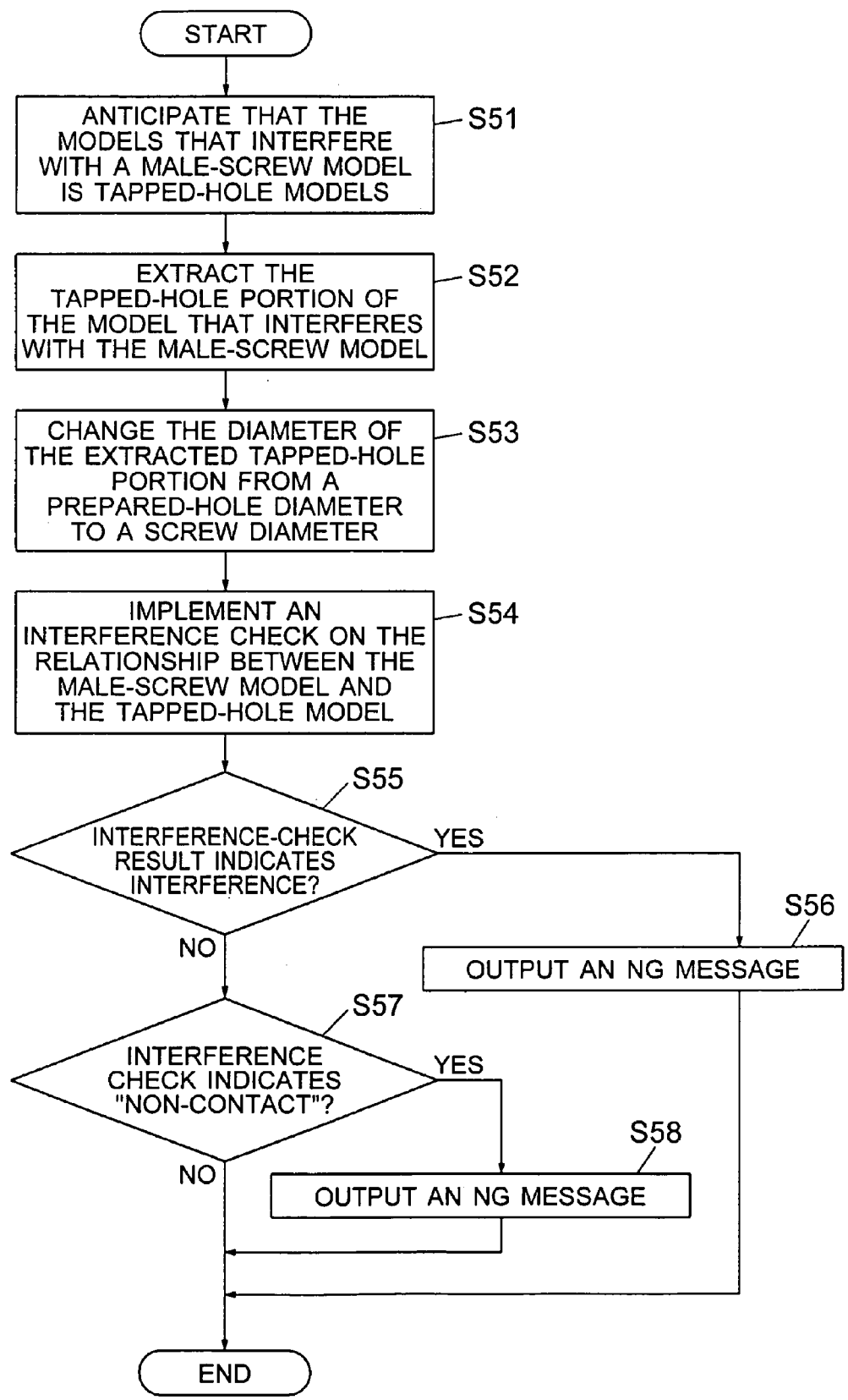
FIG. 11 is a flowchart illustrating an example of a processing flow for determining whether or not a screw fitting portion is good.

FIG. 11 is a flowchart illustrating an example of a processing flow for determining whether or not a screw fitting portion is good. The model-design verification system 1 anticipates that the models that interfere with a male-screw model is tapped-hole models (in the step S51). For example, supposing that, as denoted by a symbol I2 shown in FIG. 12A, the male-screw model 200 and a model 100 (which is a model A) interfere with each other and the male-screw model 200 and a model 101 (which is a model B) interfere with each other, it is anticipated that the model 100 and the model 101 are tapped-hole models. Next, the model-design verification system 1 extracts the tapped-hole portion of the model that interferes with the male-screw model (in the step S52). For example, a tapped-hole portion 203 is extracted from the model 100 illustrated in FIG. 12A.

Figure 12A:
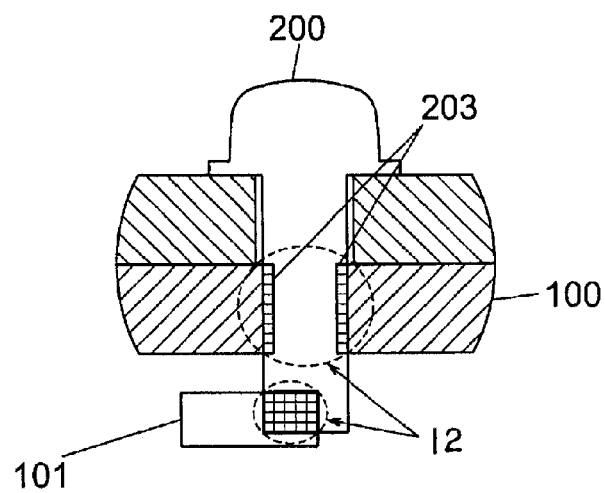
FIGS. 12A to 12C are diagrams illustrating the results of checks on the interferences between a male-screw model and other models.

Thereafter, the model-design verification system 1 changes the diameter of the extracted tapped-hole portion from a prepared-hole diameter to a screw diameter (in the step S53). Through the processing in the step S53, for example, the diameter of the tapped-hole portion 203 of the model 100 illustrated in FIG. 12A is changed to a screw diameter. Because no tapped hole exists in the model 101, the shape of the model 101 is not changed.

Figure 12B:
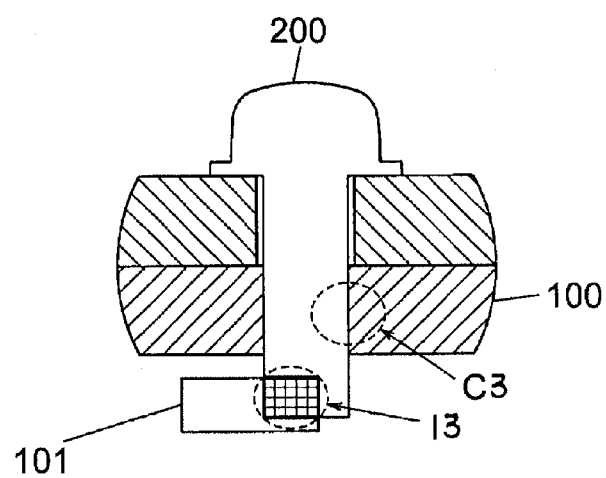

The model-design verification system 1 implements an interference check on the relationship between the male-screw model and the tapped-hole model (in the step S54) and determines whether or not the interference-check result indicates interference (in the step S55). For example, because the model shape of the model 101 is not changed, the interference check indicates that, as denoted by a symbol I3 shown in FIG. 12B, the male-screw model 200 interferes with the model 101. In the case where the interference-check result indicates "interference", the model-design verification system 1 outputs an NG message (in the step S56). For example, a message such as "a model exists that interferes with the male screw" is outputted.

Figure 12C:
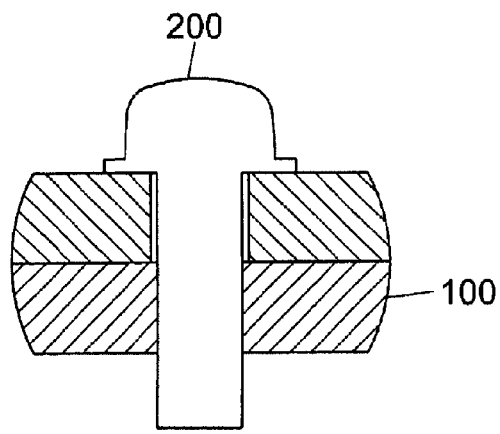

In the case where the interference-check result indicates "non-interference", the model-design verification system 1 determines whether or not the interference check indicates "non-contact" (in the step S57). In the case where the interference-check result indicates "non-contact", the model-design verification system 1 outputs an NG message (in the step S58). For example, when the interference-check result indicates that, as illustrated in FIG. 12C, the male-screw model 200 and the model 100 neither interfere nor come into contact with each other, the model-design verification system 1 determines that the screw fitting portion is defective and outputs a message such as "the male screw and the tapped hole are not fitting to each other".

When, in the step S57, it is determined that the interference-check result indicates "contact", the model-design verification system 1 ends the processing. For example, as denoted by a symbol C3 shown in FIG. 12B, the interference-check result indicates that the male-screw model 200 and the model 100 come into contact with each other in the portion that are encircled by a dotted-line circle. Accordingly, it can be seen that the model 100 is a tapped-hole model and the relationship between the male-screw model 200 and the model 100 is normal.

FIG. 13 is a table representing an example of major defective relationships between a male screw and a tapped hole and interference-check results in the case where the diameter of the tapped hole is changed to a screw diameter. For example, in the case such as where the male screw and the tapped hole are misaligned, the tapped-hole diameter is smaller than the male-screw diameter, and no attribute is given to the tapped hole, the interference-check result becomes "interference". Additionally, in the case such as where the tapped-hole diameter is larger than the male-screw diameter, the interference-check result indicates "no interference and no contact". In the case where the relationship between the male screw and the tapped hole is normal, the interference-check result indicates "contact".

FIG. 14 is a flowchart illustrating an example of a processing flow for returning the 3D model to the initial status. The model-design verification system 1 completes all the processing items for determining whether or not the screw fitting portions are good, erases the 3D model in the 3D-model storage/display unit 11 (in the step S61), loads on the 3D-model storage/display unit 11 the 3D model that has been saved in the step S1 in FIG. 2 (in the step S62), and then ends the processing. Through the processing in the step S62, the 3D model in which the tapped-hole diameter of the tapped-hole models has been changed is returned to its initial status.

What has been described herein is an example in which the present invention is embodied. However, the present invention is not limited to the example.

The program that embodies the present invention can be stored in a storage medium, such as a semiconductor memory, a hard disc, a CR-ROM, or a DVD, that can be read by a computer, and is provided by means of the storage medium or communication-interfaced transmission and reception over a network.

As explained above, according to the apparatus, method, and program for verifying model-design of the present invention, the check on the fit between a male-screw model and a tapped-hole model, which has been implemented by a CAD user, can be automatically implemented. Therefore, the man-hours for checking the fit between male-screw models and tapped-hole models can significantly be reduced.

Moreover, according to the apparatus, method, and program for verifying model-design of the present invention, by automatically checking the fit between a male-screw model and a tapped-hole model, the defect in the fit between a male-screw model and a tapped-hole model can securely be extracted. Therefore, according to the present invention, design errors can be prevented.

What is claimed is:

1. A method performed by a processor for verifying model-design which verifies design of a 3D model, the method comprising:
preparing a 3D model in a storage unit, the 3D model including a male-screw model and a tapped-hole model corresponding to the male-screw model, the male-screw model having a first diameter, the tapped-hole model having a second diameter that is a prepared-hole diameter, and the tapped hole model having an attribute that is used as a screw diameter for the second diameter;
checking at a checking unit a relationship between the first diameter of the male-screw model and the second diameter of the tapped-hole model in a first case where the second diameter is the prepared-hole diameter to obtain the relationship indicating interference between the male-screw model and the tapped-hole model based on the checking for the first case;
changing at a changing unit the second diameter of the tapped-hole model to the screw diameter from the prepared-hole diameter, when the obtained relationship that is a result of the checking on the first case indicates interference;
checking at a checking unit a relationship between the first diameter of the male-screw model and the second diameter of the tapped-hole model in a second case where the second diameter is the screw diameter to obtain the relationship indicating interference or contact between the male-screw model and the tapped-hole model based on the checking for the second case and the changing;
verifying at a model-fit verification unit fit between the male-screw model and the tapped-hole model based on a result of the checking for the first case and the checking for the second case; and
outputting a result of the model-fit verification from an output unit,
wherein the model-fit verification unit determines that the male-screw model and the tapped-hole model fit with each other when the obtained relationship that is a result of the checking in the first case indicates interference, and when the relationship that is a result of the checking in the second case indicates contact, and
wherein the output unit outputs the result of the model-fit verification indicating that the relationship between the male screw and tapped hole is not normal when the model-fit verification unit determines that the male-screw model and the tapped-hole model does not fit with each other.

2. The method according to claim 1, comprising:
changing to the screw diameter the second diameter of the tapped-hole model that interferes with the male-screw model when the result of the checking the relationship in the first case where the second diameter of the tapped-hole diameter of the tapped-hole model is the prepared-hole diameter indicates any interference.

3. The method according to claim 2, comprising:
creating a tapped-hole of the tapped-hole model in the 3D model so as to have a prepared-hole diameter and setting information on respective screw diameter corresponding to the created tapped-hole as attribute for the tapped-hole model.

4. The method according to claim 3, comprising:
saving the 3D model to which the attribute is to be set in a storage unit, and making the 3D model that has been saved in the storage unit return after the outputting the result of the model-fit verification by the output unit.

5. The method according to claim 1, comprising:
determining that the male-screw model and the tapped-hole model fit with each other when the result of checking the relationship between the male-screw model and the tapped-hole model in the first case where the second diameter of the tapped-hole model is the prepared-hole diameter indicates interference, and when the result of checking the relationship between the male-screw model and the tapped-hole model in the second case where the second diameter of the tapped-hole diameter of the tapped-hole model is the screw diameter indicates contact.

6. The method according to claim 1, comprising:
analyzing whether any model other than the tapped-hole model comes into contact with the male-screw model based on the result of the checking for the first case and the checking for the second case; and
determining that the design of the 3D model is defective when the result of analysis on whether any model other than the tapped-hole model comes into contact with the male-screw model indicates that no model interferes with the male-screw model.

7. A non-transitory computer readable storage medium storing a program for verifying model-design which verifies design of a 3D model, the program when executed causing a computer to execute an operation, comprising:
preparing a 3D model in a storage unit, the 3D model including a male-screw model and a tapped-hole model corresponding to the male-screw model, the male-screw model having a first diameter, the tapped-hole model having a second diameter that is a prepared-hole diameter, and the tapped hole model having an attribute that is used as a screw diameter for the second diameter;

checking a relationship between the first diameter of the male-screw model and the second diameter of the tapped-hole model in a first case where the second diameter is the prepared-hole diameter and in a second case where the second diameter is the screw diameter to obtain the relationship indicating interference or contact between the male-screw model and the tapped-hole model based on the checking for the first case;

verifying fit between the male-screw model and the tapped-hole model based on a result of the checking for the first case and the checking for the second case; and outputting a result of the model-fit verification from an output unit, wherein a model-fit verification unit determines that the male-screw model and the tapped-hole model fit with each other when the result of a checking the relationship between the male-screw model and the tapped-hole model in the case where the tapped-hole diameter of the tapped-hole model is the prepared-hole diameter indicates interference, and when the result of a checking the relationship between the male-screw model and the tapped-hole model in the case where the tapped-hole diameter of the tapped-hole model is the screw diameter indicates contact.

* * * * *

UNITED STATES PATENT AND TRADEMARK OFFICE
CERTIFICATE OF CORRECTION

PATENT NO. : 8,249,833 B2  
APPLICATION NO. : 11/441132  
DATED : August 21, 2012  
INVENTOR(S) : Yoshihito Okuwaki It is certified that error appears in the above-identified patent and that said Letters Patent is hereby corrected as shown below:

Title Page

Item (12) delete "et al."

Item (75) Inventors, please delete the second inventor, "Yoshikazu Katou, Kawasaki (JP)"

Item (56) Column 2 (Other Publications), Line 14, Delete "Minutes of the Hearing in the matter of corresponding German Patent Application No. 102006025490.2-53, dated Oct. 30, 2007." and insert the same on line 15 below "2007." as a new entry.

Signed and Sealed this  
Fifth Day of January, 2016

Michelle K. Lee  
*Director of the United States Patent and Trademark Office*